US012040469B2

(12) United States Patent
Kuwabara et al.

(10) Patent No.: US 12,040,469 B2
(45) Date of Patent: *Jul. 16, 2024

(54) HEAT DISSIPATING STRUCTURE AND BATTERY PROVIDED WITH THE SAME

(71) Applicant: SHIN-ETSU POLYMER CO., LTD., Tokyo (JP)

(72) Inventors: Tomohiko Kuwabara, Saitama (JP); Hitoshi Ando, Saitama (JP); Takao Shimizu, Saitama (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 634 days.

This patent is subject to a terminal disclaimer.

(21) Appl. No.: 17/294,724

(22) PCT Filed: Oct. 28, 2019

(86) PCT No.: PCT/JP2019/042192
§ 371 (c)(1),
(2) Date: May 18, 2021

(87) PCT Pub. No.: WO2020/105377
PCT Pub. Date: May 28, 2020

(65) Prior Publication Data
US 2022/0013830 A1      Jan. 13, 2022

(30) Foreign Application Priority Data

Nov. 21, 2018 (JP) .................................. 2018-218082

(51) Int. Cl.
*H01M 10/6556* (2014.01)
*H01L 23/367* (2006.01)
(Continued)

(52) U.S. Cl.
CPC ...... *H01M 10/6556* (2015.04); *H01L 23/367* (2013.01); *H01M 10/613* (2015.04);
(Continued)

(58) Field of Classification Search
None
See application file for complete search history.

(56) References Cited

U.S. PATENT DOCUMENTS 11,387,504 B2 *   7/2022   Shimizu ............. H05K 7/20263

FOREIGN PATENT DOCUMENTS

JP         2008243999 A       10/2008

OTHER PUBLICATIONS

International Search Report in PCT/JP2019/042192, mailed Nov. 19, 2019. 7pp.

* cited by examiner

*Primary Examiner* — Jonathan Crepeau
(74) *Attorney, Agent, or Firm* — HAUPTMAN HAM, LLP

(57) ABSTRACT

A heat dissipation structure for a battery includes a plurality of heat dissipation members. The heat dissipation members are each provided with: a heat conductive sheet having a shape that extends while winding in a spiral shape for transferring the heat from the heat source, a cushion member which is provided on an annular rear surface of the heat conductive sheet and can be more easily deformed to conform to the outer surface shape of the heat source than the heat conductive sheet, and a penetration path penetrating in the direction in which the heat conductive sheet extends while winding. The plurality of heat dissipation members is connected to each other by connection members in a state of being aligned in a direction perpendicular to the direction in which the beat conductive sheet extends while winding.

8 Claims, 7 Drawing Sheets

(51) Int. Cl.
  *H01M 10/613* (2014.01)
  *H01M 10/653* (2014.01)
  *H01M 10/655* (2014.01)
  *H01M 10/6567* (2014.01)
  *H01M 50/204* (2021.01)
  *H01M 50/242* (2021.01)
  *H05K 7/20* (2006.01)
  *H01M 50/224* (2021.01)

(52) U.S. Cl.
  CPC ....... *H01M 10/653* (2015.04); *H01M 10/655* (2015.04); *H01M 10/6567* (2015.04); *H01M 50/242* (2021.01); *H01M 50/204* (2021.01); *H01M 50/224* (2021.01); *H05K 7/2039* (2013.01)

HEAT DISSIPATING STRUCTURE AND BATTERY PROVIDED WITH THE SAME

CROSS REFERENCE

The present application is a National Phase of International Application Number PCT/JP2019/042192 filed Oct. 28, 2019, and claims priority from Japanese patent application JP2018-218082 filed on Nov. 21, 2018, the content of which is hereby incorporated by reference into this application. Contents of patents, patent applications, and documents cited herein are incorporated by reference into this application.

TECHNICAL FIELD

The present invention relates to a heat dissipating structure and a battery provided with the same.

BACKGROUND ART

A control system of automobiles, aircrafts, ships or electronic devices for home use or business use has become further complicated and highly accurate, and correspondingly the integration of small electronic components on a circuit board has been increasingly densified. As a result, it is strongly requested to solve malfunction or shortening of service life of the electronic components owing to heat generated in the periphery of the circuit board.

Conventionally, rapid heat dissipation from the circuit board has been implemented by using the material excellent in heat dissipation, mounting the heat sink, or driving a heat dissipating fan either in an individual or complex manner. Above all, the method of forming the circuit board itself using the material excellent in heat dissipation, for example, diamond, aluminum nitride (AlN), cubic boron nitride (cBN) or the like extremely increases the cost of the circuit board. Additionally, placement of the heat dissipating fan causes problems of malfunction of a fan as the rotator, need of maintenance for preventing the malfunction, and difficulty in securing a mount space. Meanwhile, the heat dissipating fin is a simple member capable of increasing a surface area by forming many columnar or flat plate-like projections made of high heat conduction metal (for example, aluminum) to further enhance heat dissipation. The heat dissipating fin has been generally used as the heat dissipating component (see Patent Literature 1).

Recently, for the purpose of reducing a load to global environment, conversion of a conventional gasoline-powered vehicle or a diesel vehicle into an electric automobile has become a global upward trend. Particularly, China as well as European countries such as France, Netherlands, and Germany has declared to shift toward the automobile market for 100% electric automobiles from the gasoline-powered vehicles and the diesel vehicles by the year 2040. To encourage widespread adoption of electric automobiles, constructing more charging stands is required in addition to development of high-performance batteries. Particularly, technological development for enhancing a charging-discharging function of a lithium automobile battery is an important issue. It is well known that automobile batteries cannot sufficiently exert charging-discharging functions under a high temperature of 60° C. or higher. Therefore, as with the aforementioned circuit board, heat dissipating enhancement is regarded as an important issue for the battery.

In order to implement the rapid heat dissipation from the battery, the structure to be described below has been employed. The structure is formed by disposing a water-cooling pipe in a housing formed of metal excellent in heat conductivity such as aluminum. Many battery cells are disposed in the housing, and a rubber sheet with adhesiveness is interposed between the battery cells and a bottom surface of the housing. The above-structured battery allows the battery cells to conduct heat to the housing via the rubber sheet, and to effectively remove heat through water cooling.

CITATION LIST

Patent Literature

Patent Literature 1: Japanese Patent Laid-Open No. 2008-243999

SUMMARY OF INVENTION

Technical Problem

The heat conductivity of the rubber sheet used for the generally employed battery is lower than that of aluminum or graphite. Therefore, it is difficult to effectively transfer heat from the battery cells to the housing. The use of a spacer of graphite or the like to be interposed in place of the rubber sheet may be considered. However, as the battery cells are not flat because of stepped lower surfaces, gaps are formed between the battery cells and the spacer, resulting in deteriorated heat conduction efficiency. As described in the example, the battery cells can take various forms (including uneven or surface state such as the stepped portion), and therefore the demand for adaptability to the various forms of the battery cells, and achievement of high heat conduction efficiency has been increasing. Furthermore, the use of an elastically deformable material lighter in weight for the container of the battery cell has been demanded. A heat dissipating structure has been demanded to allow weight reduction of the battery cell, and restoration of the shape nearly to the original state after removing the battery cells. This applies not only to the battery cell but also to other heat sources such as the circuit board, the electronic component, and the electronic device body.

In light of the foregoing circumstances, the present invention provides a heat dissipating structure adaptable to various forms of heat source, light in weight, elastically deformable, and excellent in heat dissipating efficiency, and a battery having the heat dissipating structure.

Solution to Problem (1) To achieve the object, a heat dissipating structure according to an embodiment has a plurality of heat dissipating members connected for enhancing heat dissipation from a heat source. Each of the heat dissipating members includes a heat conduction sheet in a spirally winding shape for conducting heat from the heat source, a cushion member that is provided on an annular back surface of the heat conduction sheet, and is deformable following a surface shape of the heat source more easily than the heat conduction sheet, and a through passage penetrating in a winding direction of the heat conduction sheet. The heat dissipating members orthogonally arranged to a spirally winding direction of the heat conduction sheet are connected by a connection member.

(2) In the heat dissipating structure according to another embodiment, preferably, the cushion member is cylindrically shaped, and includes the through passage extending in the longitudinal direction. The heat conduction sheet is spirally wound around an outer surface of the cylindrically shaped cushion member.

(3) In the heat dissipating structure according to another embodiment, preferably, the cushion member is spirally shaped, and spirally winding along the annular back surface of the heat conduction sheet.

(4) In the heat dissipating structure according to another embodiment, preferably, the connection member is formed of a thread, and includes a twisted portion between the heat dissipating members. The heat dissipating members are connected by the thread in the direction orthogonal to the winding direction of the heat conduction sheet.

(5) In the heat dissipating structure according to another embodiment, preferably, the heat dissipating members are arranged at gaps each corresponding to a value 0.114 times a circular conversion diameter of the heat dissipating member or greater.

(6) In the heat dissipating structure according to another embodiment, preferably, a heat conduction oil is applied to a surface of the heat conduction sheet for enhancing heat conductivity to the surface from the heat source in contact with the surface.

(7) In the heat dissipating structure according to another embodiment, preferably, the heat conduction oil contains a silicone oil and a heat conduction filler that exhibits higher heat conductivity than the silicone oil. The heat conduction filler is formed of at least one of metal, ceramics, and carbon.

(8) A battery according to one embodiment includes one or more battery cells each as a heat source in a housing that allows flow of a cooling agent. The heat dissipating structure of any one of (1) to (7) is disposed between the battery cell and the housing.

Advantageous Effect of Invention

The present invention provides the heat dissipating structure adaptable to various forms of heat source, light in weight, elastically deformable, and excellent in heat dissipating efficiency, and the battery having the heat dissipating structure.

DESCRIPTION OF EMBODIMENTS

Figure 1A:
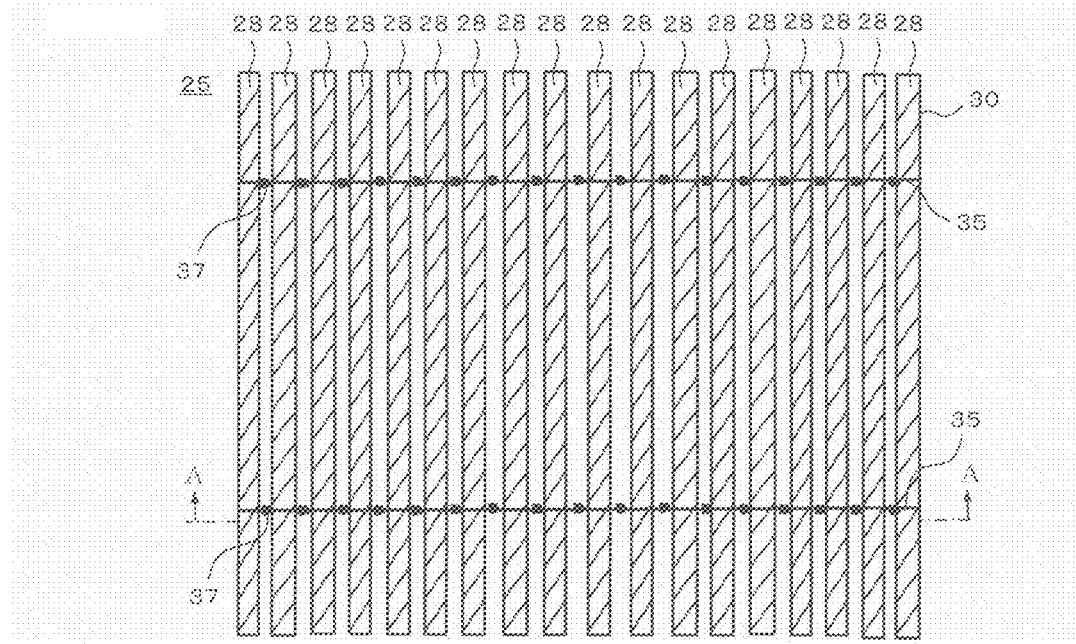
FIG. 1A is a plan view of a heat dissipating structure according to a first embodiment.

Embodiments of the present invention are described referring to the drawings. Each embodiment described herein does not limit the invention according to the scope of the claims, and all elements described in each embodiment, and all combinations thereof are not necessarily essential for implementing the present invention.

First Embodiment

Figure 1B:
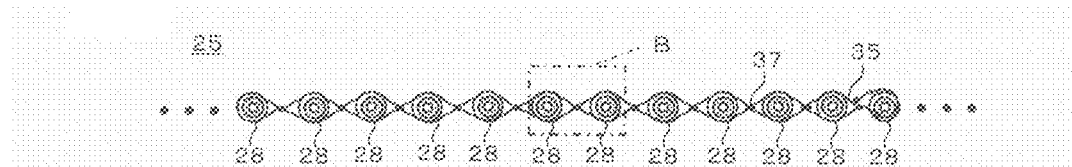
FIG. 1B is a sectional view taken along line A-A of FIG. 1A.
Figure 1C:
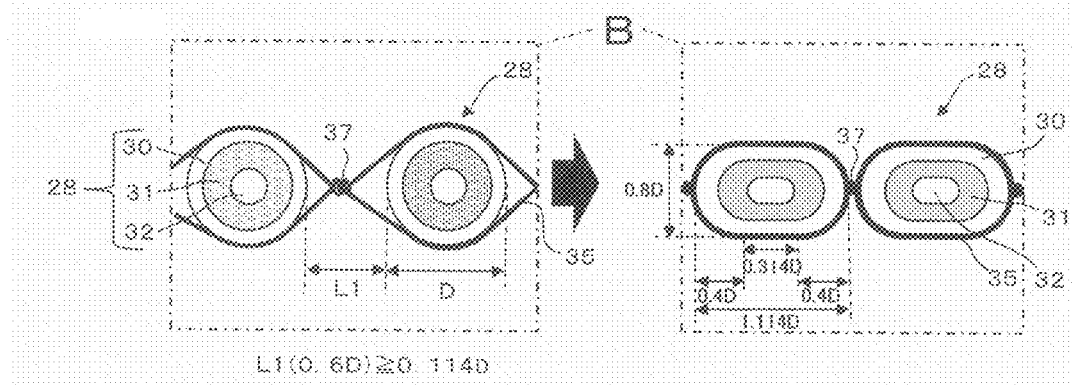
FIG. 1C is an enlarged view of a region B of FIG. 1B.
Figure 2A:
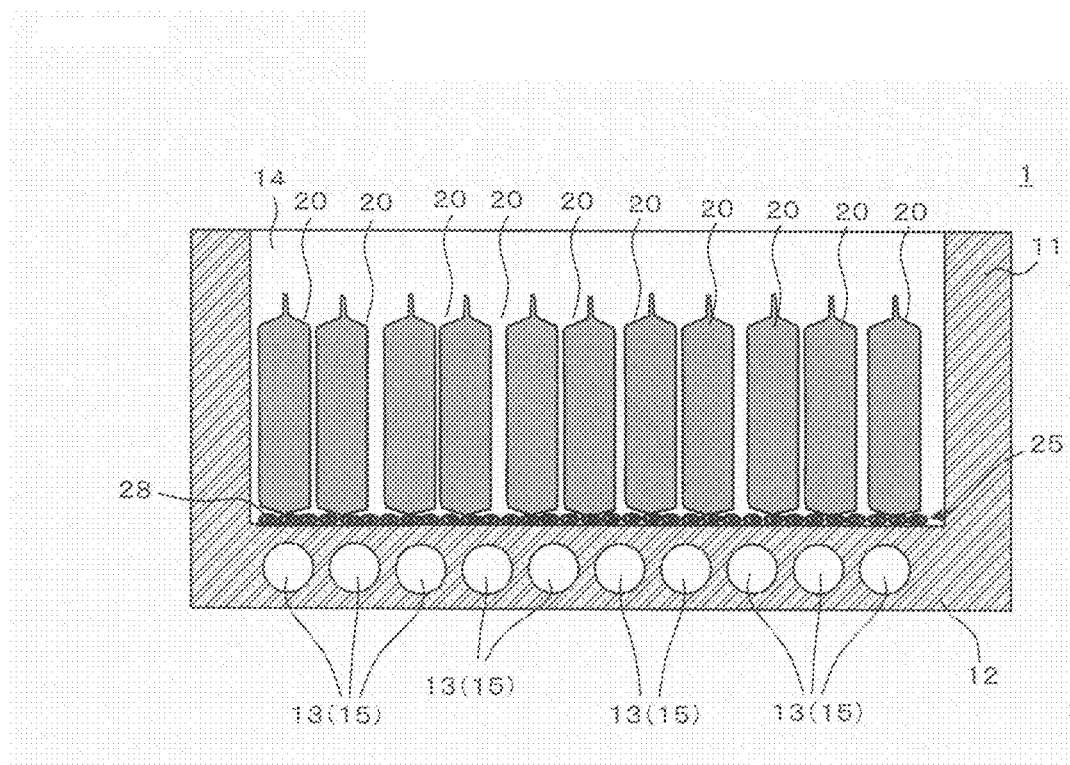
FIG. 2A is a longitudinal sectional view of the heat dissipating structure according to the first embodiment, and a battery having the heat dissipating structure.
Figure 2B:
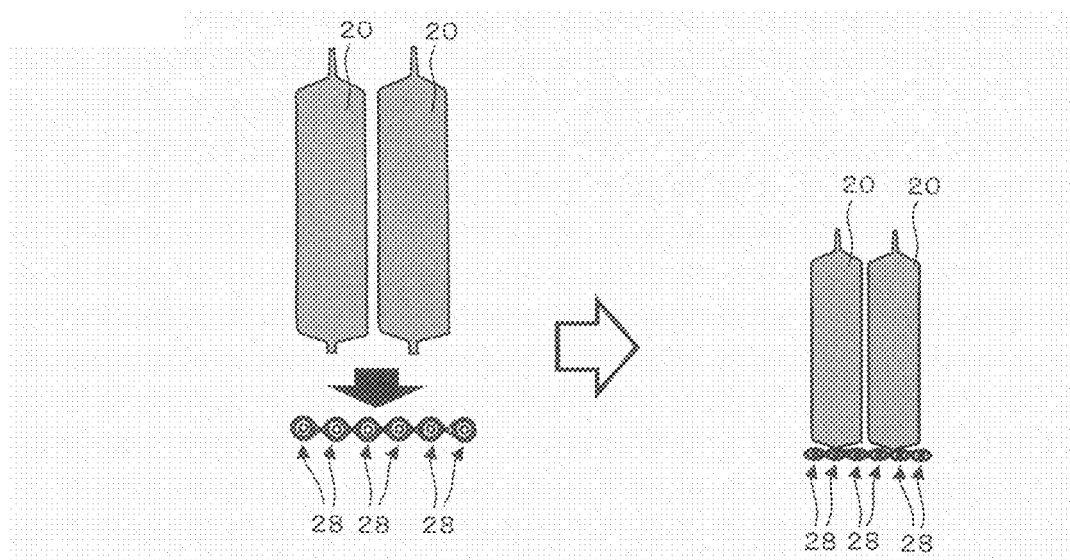
FIG. 2B is a sectional view illustrating change in formation of the heat dissipating structure before and after it is compressed by battery cells in FIG. 2A.

FIG. 1A is a plan view of a heat dissipating structure according to a first embodiment. FIG. 1B is a sectional view taken along line A-A of FIG. 1A. FIG. 1C is an enlarged view of a region B of FIG. 1B. FIG. 2A is a longitudinal sectional view of the heat dissipating structure according to the first embodiment, and a battery having the heat dissipating structure. FIG. 2B is a sectional view illustrating change in formation of the heat dissipating structure before and after it is compressed by battery cells as shown in FIG. 2A.

As illustrated in FIG. 2A, a battery 1 is structured to have a plurality of battery cells 20 in a housing 11 in contact with cooling agent 15. Preferably, a heat dissipating structure 25 is provided between the battery cells 20 as heat sources at proximal ends (lower ends) closer to the cooling agent 15, and a part (bottom 12) of the housing 11 at a side closer to the cooling agent 15. As illustrated, the heat dissipating structure 25 accommodates 11 battery cells 20. However, the number of the battery cells 20 to be placed on the heat dissipating structure 25 is not limited to 11. The number of heat dissipating members 28 constituting the heat dissipating structure 25 disposed in the battery 1 is not specifically limited.

The heat dissipating structure 25 is formed with the heat dissipating members 28 connected for enhancing heat dissipation from the battery cells 20. The heat dissipating member 28 includes a spirally winding heat conduction sheet 30 for conducting heat from the battery cell 20, a cushion member 31 that is provided on an annular back surface of the heat conduction sheet 30, and more deformable following the surface shape of the battery cell 20 than the heat conduction sheet 30, and a through passage 32 penetrating in the spirally winding direction of the heat conduction sheet 30. A connection member 35 is used for connecting multiple heat dissipating members 28 orthogonally arranged to the winding direction of the heat conduction sheet 30. The heat conduction sheet 30 is preferably formed of a material with superior heat conductivity to that of the cushion member 31. The cushion member 31 is preferably formed in a cylindrical shape, having a through passage 32 in the longitudinal direction. The heat conduction sheet 30 is spirally wound around an outer surface of the cylindrical cushion member. Preferably, in the heat dissipating structure 25, heat conduction oil is applied to the surface and/or inside of the heat conduction sheet 30 for enhancing heat conductivity to the surface from the battery cells 20 in contact therewith. Each of the heat dissipating members 28 constituting the heat dissipating structure 25 has a substantially cylindrical shape when the battery cells 20 are not mounted. Once the battery cells 20 are mounted, the heat dissipating members 28 will be compressed and flattened under the heavy load.

The heat conduction sheet 30 has a belt-like shape while spirally winding in the longitudinal direction of the substantially cylindrical shape around the outer surface of the heat dissipating member 28. The heat conduction sheet 30 contains at least one of metal, carbon, and ceramics, and has a function of conducting heat from the battery cells 20 to the cooling agent 15. The term "cross section" or "longitudinal cross section" to be used herein refers to a cross section in a vertically cutting direction from an upper opening surface of an inside 14 of the housing 11 of the battery 1 to the bottom 12.

Schematic structures of the battery 1 and components of the heat dissipating structure 25 are described in more detail.
(1) Summary of Battery Structure In this embodiment, the battery 1 is, for example, employed for an electric automobile, and includes many battery cells 20 (simply referred to as cells). The battery 1 includes a bottomed housing 11 having an opening on one side. The housing 11 is preferably formed of aluminum or aluminum base alloy. The battery cells 20 are disposed in the inside 14 of the housing 11. Electrodes (not illustrated) project from the upper sides of the battery cells 20, respectively. The battery cells 20 preferably in the housing 11 are in tight contact with each other (not illustrated) by application of force in the compressing direction from both sides by utilizing screws or the like. The bottom 12 of the housing 11 is provided with one or more water-cooling pipes 13 to allow flow of cooling water as the cooling agent 15. The cooling agent may be referred to as a cooling medium or a cooling member. The battery cells 20 are disposed inside the housing 11 to interpose the heat dissipating structure 25 with the bottom 12. In the above-structured battery 1, heat of the battery cells 20 is conducted to the housing 11 through the heat dissipating structure 25 and effectively removed by water cooling. The cooling agent 15 is not limited to the cooling water, but may be interpreted to include an organic solvent such as liquid nitrogen and ethanol. The cooling agent 15 is not limited to liquid when used for cooling, but may be in gaseous or solid form.
(2) Heat Conduction Sheet The heat conduction sheet 30 preferably contains carbon, and more preferably contains carbon filler and resin. The resin may be replaced with a synthetic fiber. In this case, preferably, aramid fiber is usable. The "carbon" described herein may be widely interpreted to contain an arbitrary structure composed of carbon (C) such as graphite, carbon black with lower crystallinity than graphite, expanded graphite, diamond, diamond-like carbon having a similar structure to diamond. In this embodiment, the heat conduction sheet 30 may be a thin sheet obtained by curing a material having graphite fiber or carbon particles compounded and dispersed in resin. The heat conduction sheet 30 may be the carbon fiber formed through meshed weaving, mixed spinning, or mixed knitting. Various types of fillers such as graphite fiber, carbon particles, and carbon fiber may be considered to fall under the concept of the carbon filler.

The resin contained in the heat conduction sheet 30 may or may not exceed 50 mass % to the total mass of the heat conduction sheet 30. That is, the resin may or may not be used as a main material for forming the heat conduction sheet 30 as long as the resultant heat conduction is not seriously affected. The thermoplastic resin may be suitably used as the resin, for example. It is preferable to use the resin with high melting point at which it may be kept unmelted in heat conduction from the battery cell 20 as the heat source, for example, polyphenylene sulfide (PPS), polyetheretherketone (PEEK), polyamide imide (PAI), and aromatic polyamide (aramid fiber). Before formation of the heat conduction sheet 30, the resin is dispersed in gaps in the carbon filler in the form of particle or fiber. The heat conduction sheet 30 may be formed to have AlN or diamond dispersed as the filler for enhancing heat conduction besides the carbon filler, resin and the like. In place of the resin, elastomer more flexible than the resin may be used. The heat conduction sheet 30 may be formed as the sheet that contains metal and/or ceramics in place of or together with carbon. It is possible to selectively use metal with relatively high heat conductivity such as aluminum, copper, and an alloy containing at least one of those metals. It is possible to selectively use ceramics with relatively high heat conductivity such as AlN, cBN, and hBN.

The heat conduction sheet 30 may or may not be excellent in electrical conductivity. Preferably, the heat conductivity of the heat conduction sheet 30 is equal to or higher than 10 W/mK. In the embodiment, the heat conduction sheet 30 is preferably the belt-shaped plate formed of the material excellent in heat conductivity and electrical conductivity, for example, graphite, aluminum, aluminum alloy, copper, or stainless steel. Preferably, the heat conduction sheet 30 exhibits sufficient curving property (or bending property). Although the thickness of the sheet is not limited to the specific value, it is preferable to use a sheet with a thickness ranging from 0.02 to 3 mm, and more preferably, ranging from 0.03 to 0.5 mm. As the thickness increases, the heat conductivity of the heat conduction sheet 30 is lowered. It is preferable to determine the thickness by considering the balance among properties of the sheet such as strength, flexibility, and heat conductivity.
(3) Cushion Member The cushion member 31 has essential functions of deformability and restorability. The restorability is determined by elastic deformation capability. The deformability is a necessary property for following the shape of the battery cell 20. Particularly, the battery cell 20 in an easily deformable package that houses semisolid product such as lithium ion battery, a content having a liquid property and the like is likely to have its design dimension indeterminable, or its dimensional accuracy hardly improved. Therefore, it is important to secure the restorability to retain the deformability and the follow-up property of the cushion member 31.

In this embodiment, the cushion member 31 is cylindrical, and includes the through passage 32. Although the lower ends of the battery cells 20 are not flat, the cushion member 31 improves the contact between the heat conduction sheet 30 and the lower ends. The through passage 32 makes the cushion member 31 easily deformable, contributes to weight reduction in the heat dissipating structure 25, and has a function of enhancing the contact between the heat conduction sheet 30 and the lower ends of the battery cells 20. The cushion member 31 has a function as a protective member that prevents the heat conduction sheet 30 from being damaged due to the load applied thereto, in addition to a function of imparting a cushioning function between the battery cells 20 and the bottom 12. In this embodiment, the cushion member 31 exhibits the heat conductivity lower than that of the heat conduction sheet 30.

The cushion member 31 is preferably formed to contain thermosetting elastomer such as silicone rubber, urethane rubber, isoprene rubber, ethylene-propylene rubber, natural rubber, ethylene-propylene-diene rubber, nitrile rubber (NBR), styrene-butadiene rubber (SBR), and the like; urethane-based, ester-based, styrene-based, olefin-based, butadiene-based, or fluorine-based thermoplastic elastomer; or composite thereof. Preferably, the cushion member 31 is formed of a material with high heat resistance that allows retention of formation of the heat conduction sheet 30 without being molten or decomposed by the conducted heat. In this embodiment, more preferably, the cushion member 31 is formed of a material obtained by impregnating silicone into urethane-based elastomer, or silicone rubber. The cushion member 31 may be formed by dispersing the filler represented by, for example, particles of AlN, cBN, hBN, or diamond into rubber to enhance heat conductivity as high as possible. The cushion member 31 may or may not be formed as the material containing bubbles. The "cushion member" represents an elastically deformable member with high flexibility, and capable of being in tight contact with a surface of the heat source, and can be replaced with a term "rubber elastic structure" in the context herein. Furthermore, as a modification of the cushion member 31, metal may be used in place of the rubber elastic structure. For example, the cushion member can be constituted by spring steel. Furthermore, as the cushion member, a coil spring can be disposed. Additionally, spirally wound metal may be used as the spring steel, and disposed on the annular back surface of the heat conduction sheet 30 as the cushion member.

(4) Connection Member

The connection member 35 is formed of a material, for example, thread and rubber, which is partially deformable at least between the heat dissipating members 28. In this embodiment, the connection member 35 is preferably formed of the thread. More preferably, the thread is resistant to temperature rise owing to heat dissipation from the battery cell 20. Specifically, the connection member 35 preferably is formed of the thread that is resistant to high temperature of approximately 120° C., and composed of a twisted yarn such fibers as natural fibers, synthetic fibers, carbon fibers, and metal fibers. Preferably, the connection member 35 includes twisted portions 37 each between the heat dissipating members 28 (see FIG. 1C). In the heat dissipating structure 25, although the heat dissipating member 28 is flattened under the pressure force applied by the battery cell 20, the connection member 35 flexibly deflects while following the deforming heat dissipating member 28. This allows the heat dissipating structure 25 to follow and come into tight contact with the surface of the battery cell 20. The heat dissipating structure 25 including the twisted portions 37 each interposed between the heat dissipating members 28 further enhances the follow-up property and adhesiveness with the surface of the battery cell 20. However, the connection member 35 does not necessarily include the twisted portion 37.

Upon reception of pressure force from the battery cell 20, the heat dissipating members 28 are crushed to reduce a gap L1 therebetween. If the heat dissipating members 28 are hardly crushed, there may cause the risk of deteriorating adhesiveness between the heat conduction sheet 30 and the battery cells 20, and the heat conduction sheet 30 and the bottom 12. Such risk may be reduced by setting the thickness of the heat dissipating member 28 in the height direction to be under the vertical pressure force from the bottom of the battery cell 20 to the surface of the bottom 12 to at least 80% of the cross section-diameter of the heat dissipating member 28 (=circular conversion diameter: D). The term "circular conversion diameter" refers to a diameter of a perfect circle with the same area as that of the cross section of the heat dissipating member 28 to be cut perpendicularly to the longitudinal direction. If the heat dissipating member 28 is formed into a cylindrical structure having the cross section formed into the perfect circle, the diameter is equal to the circular conversion diameter. Upon reception of the pressure force, the heat dissipating member 28 can be assumed to deform to have flat surfaces in contact with the battery cell 20 and the bottom 12, and an arc-like section along the gap L1 between the heat dissipating members 28 (see FIG. 1C). When the heat dissipating member 28 is crushed to have a thickness of 0.8D corresponding to 80% of the circular conversion diameter D, the resultant extension amount of the heat dissipating member 28 in the direction of the gap L1 is calculated. Referring to FIG. 1C, the total extension length of the arc-like sections of the crushed heat dissipating member 28 at left and right sides is $0.8\pi D$. The length of the flat surface in contact with the bottom 12 is half the length derived from subtracting the total extension length of the arc-like sections from the circumference of cross section of the heat dissipating member 28 as follows: $(\pi CD - 0.8\pi D)/2 = 0.314D$. The length of the arc-like sections extending leftward and rightward along the flat surface is calculated as follows: $0.4D \times 2 = 0.8D$. The length of the crushed heat dissipating member 28 extending from the original state in the direction of the gap L1 is calculated as follows: $0.314D + 0.8D - D = 0.114D$. The sufficiently large gap L1 prevents the contact between the adjacent heat dissipating members 28. Conversely, excessively small gap L1 may bring the adjacent heat dissipating members 28 into contact with each other, and prevent them from being further crushed even under the vertically compressed state. The gap L1 set to 11.4% of the circular conversion diameter D of the heat dissipating member 28 or greater prevents the contact between the adjacent heat dissipating members 28 when they are deformed under pressure force to have the thickness 80% of the circular conversion diameter D. This makes it possible to prevent the contact state from being obstacle to further deformation of the heat dissipating members 28. In this embodiment, the gap L1 is set to 0.6D.

(5) Heat Conduction Oil

Preferably, the heat conduction oil contains silicone oil, and a heat conduction filler that exhibits higher heat conductivity than the silicone oil, and is composed of at least one of metal, ceramics, and carbon. The heat conduction sheet 30 includes a gap (hole or recess portion) on a microscopic level. Normally, air existing in the gap may exert adverse influence on the heat conductivity. The heat conduction oil is filled in the gap to remove air to enhance heat conductivity of the heat conduction sheet 30.

The heat conduction oil is applied to the surface of the heat conduction sheet 30, specifically, at least the surface on which the battery cells 20 come in contact with the heat conduction sheet 30. In the present invention, the "oil" of the heat conduction oil refers to a water-insoluble combustible substance in either liquid or semi-solid form at normal temperature (arbitrary temperature in the range from 20 to 25° C.). It is possible to use the term "grease" or "wax" in place of the term "oil". The heat conduction oil hardly becomes the obstacle to heat conduction upon heat transfer from the battery cell 20 to the heat conduction sheet 30. A hydrocarbon-based oil and the silicone oil may be used for forming the heat conduction oil. Preferably, the heat conduction oil contains the silicone oil, and the heat conduction filler that exhibits higher heat conductivity than the silicone oil, and is composed of at least one of metal, ceramics, and carbon.

Preferably, the silicone oil is composed of particles having siloxane bond of 2000 or less with linear chain structure. The silicone oil has two types of straight silicone oil and modified silicone oil. The straight silicone oil includes dimethyl silicone oil, methylphenyl silicone oil, and methyl hydrogen silicone oil. The modified silicone oil includes reactive silicon oil and non-reactive silicone oil. The reactive silicone oil includes various types such as amino modified type, epoxy modified type, carboxy modified type, carbinol modified type, methacryl modified type, mercapto modified type, and phenol modified type. The non-reactive silicone oil includes various types such as polyether modified type, methylstyryl modified type, alkyl modified type, higher fatty acid ester modified type, hydrophilic specific modified type, higher fatty acid contained type, and fluorine modified type. Because of properties excellent in heat resistance, cold resistance, viscosity stability, and heat conductivity, the silicone oil is applied to the surface of the heat conduction sheet 30 to serve as the heat conduction oil especially suitable for intervening between the battery cell 20 and the heat conduction sheet 30.

Preferably, the heat conduction oil contains the heat conduction filler composed of at least one of metal, ceramics, and carbon besides the oil content. Gold, silver, copper, aluminum, beryllium, tungsten and the like are exemplified as metal. Alumina, aluminum nitride, cubic boron nitride, hexagonal boron nitride, and the like are exemplified as ceramics. Diamond, graphite, diamond-like carbon, amorphous carbon, carbon nanotube and the like are exemplified as carbon.

Preferably, the heat conduction oil intervenes between the heat conduction sheet 30 and the housing 11 besides the intervention between the battery cell 2 and the heat conduction sheet 30. The heat conduction oil may be applied to the surface of the heat conduction sheet 30 entirely or partially. Application of the heat conduction oil to the heat conduction sheet 30 is not necessarily limited to the specific method. The heat conduction oil may be applied arbitrarily by, for example, atomization using the spray, application using the brush or the like, immersion of the heat conduction sheet 30 in the heat conduction oil, and the like. Preferably, the heat conduction oil is used as an element to be suitably added to the heat dissipating structure 25 or the battery 1 rather than as the requisite element therefor. This applies to a second and subsequent embodiments.

Figure 3A:
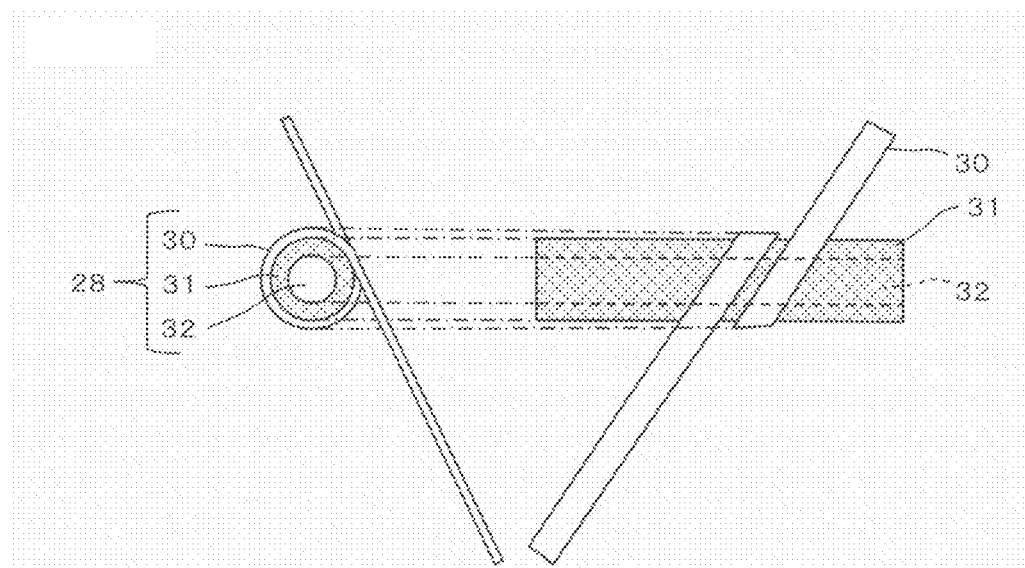
FIG. 3A is an explanatory view showing a part of a process of forming the heat dissipating structure of FIG. 1A.
Figure 3B:
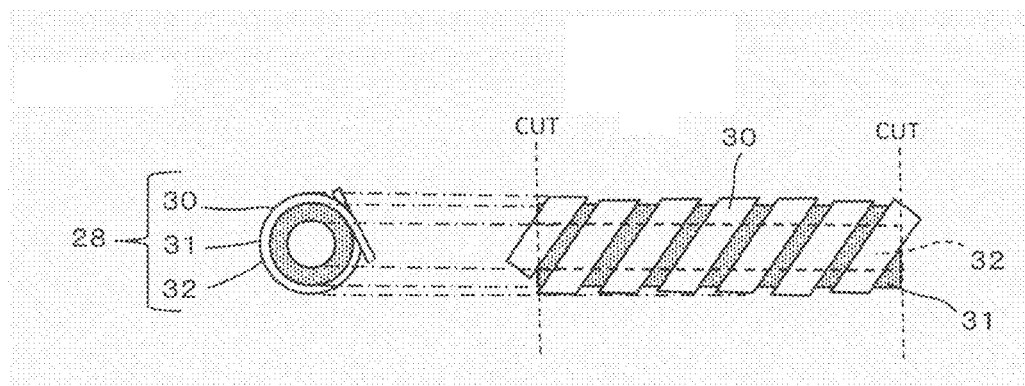
FIG. 3B is an explanatory view showing a part of a process of forming the heat dissipating structure of FIG. 1A.
Figure 3C:
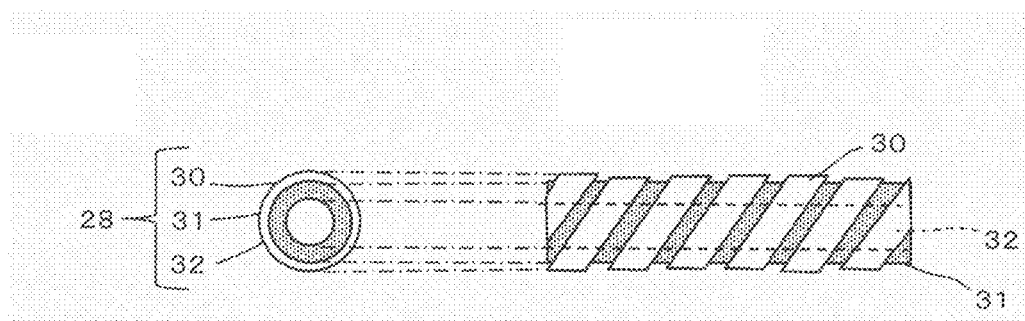
FIG. 3C is an explanatory view showing a part of a process of forming the heat dissipating structure of FIG. 1A.

FIGS. 3A, 3B and 3C illustrate a part of a process of forming the heat dissipating structure of FIG. 1A.

The cushion member 31 is formed. While the cushion member 31 is in the uncured state before it is completely cured, the belt-like heat conduction sheet 30 is spirally wound around an outer surface of the cushion member 31. The cushion member 31 is then completely cured in heating. Portions of the belt-like heat conduction sheet 30, protruding from both ends of the cushion member 31 are cut. Finally, the heat conduction oil is applied to the surface of the heat conduction sheet 30. In forming the heat dissipating member 28 as described above, the uncured cushion member 31 enters into the gap on the microscopic level generated in the heat conduction sheet 30, and then cured therein. This makes it possible to firmly fix the heat conduction sheet 30 to the cushion member 31 without using the adhesive agent or the like.

The formed heat dissipating member 28 protrudes from the outer surface of the cushion member 31 by the amount corresponding to the thickness of the heat conduction sheet 30. The heat conduction sheet 30 may be flush with the cushion member 31. The heat conduction oil may be applied to the surface of the heat conduction sheet 30, at least on the region in contact with the battery cell 20. Each timing for executing the process of cutting the heat conduction sheet 30 protruding from both sides of the cushion member 31, and the process of applying the heat conduction oil is arbitrarily set without being limited to the timing as described above. Those processes may be executed at arbitrary timings as long as they are executed after winding the heat conduction sheet 30 around the cushion member 31. The heat conduction sheet 30 may be wound around the outer surface of the cushion member 31 in the completely cured state. If the outer surface of the cushion member 31 is not adhesive, the heat conduction sheet 30 may be fixed to the cushion member 31 using the adhesive agent or the like.

The heat dissipating structure 25 is formed in the following process. The formed heat dissipating members 28 are orthogonally arranged to the winding direction of the heat conduction sheet 30, and connected by the connection member 35. More specifically, the heat dissipating structure 25 is formed by connecting the arranged heat dissipating members 28 with the thread by manual sewing. Preferably, the heat dissipating members 28 are arranged at each gap L1 therebetween set to 0.114D or greater (see FIG. 1C). Preferably, the sewing is performed to form the twisted portion 37 between the heat dissipating members 28. In the heat dissipating structure 25 having the blind-like connected heat dissipating members 28, under the pressure force from the battery cell 20, the heat dissipating member 28 is crushed to be vertically and horizontally expanded following the surface of the battery cell 20. When the battery cells 20 are removed, elastic force of the heat dissipating member 28 restores its original shape. The heat dissipating structure 25 having the blind-like connected heat dissipating members 28 may restrain uneven distribution thereof owing to vibration of the automobile or the like, for example, and improve workability. In the heat dissipating structure 25, as each of the heat dissipating members 28 has the heat conduction sheet 30 spirally wound around the outer surface of the cushion member 31, the cushion member 31 will be deformed without excessive constraint.

Second Embodiment

A heat dissipating structure according to a second embodiment, and a battery having the heat dissipating structure are described. Portions common with those of the first embodiment are denoted by the same reference numerals, and redundant description is omitted.

Figure 4A:
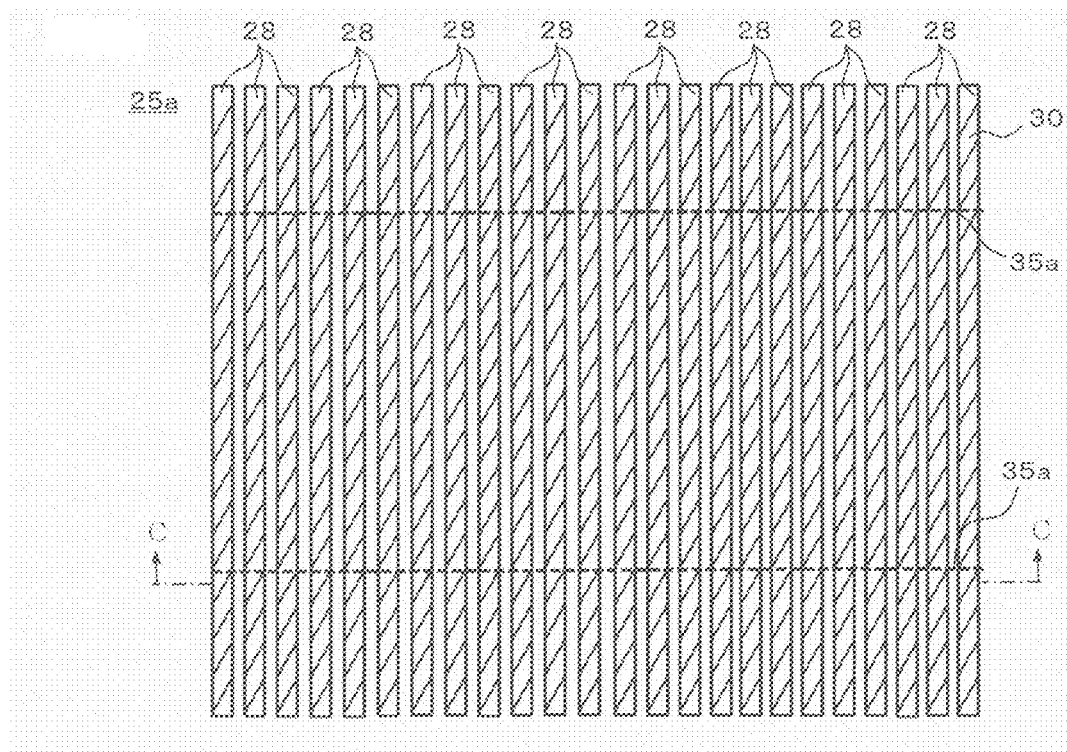
FIG. 4A is a plan view of a heat dissipating structure according to a second embodiment.
Figure 4B:
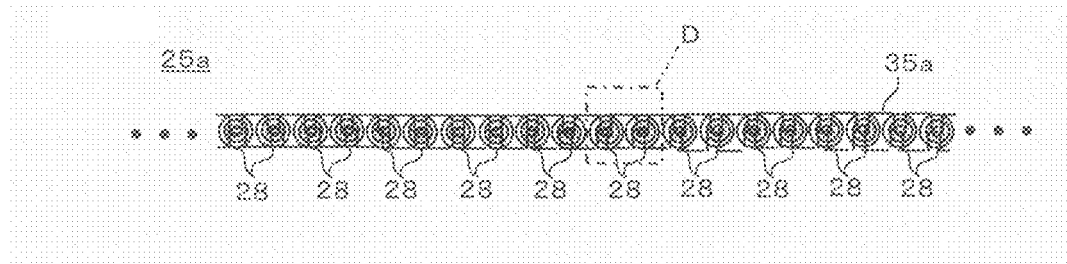
FIG. 4B is a sectional view taken along line C-C of FIG. 4A.
Figure 4C:
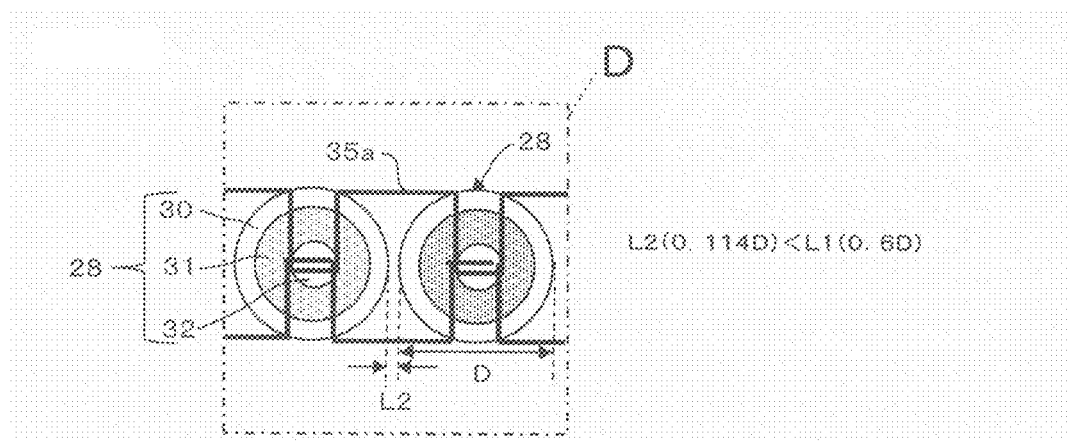
FIG. 4C is an enlarged view of a region D of FIG. 4B.
Figure 5A:
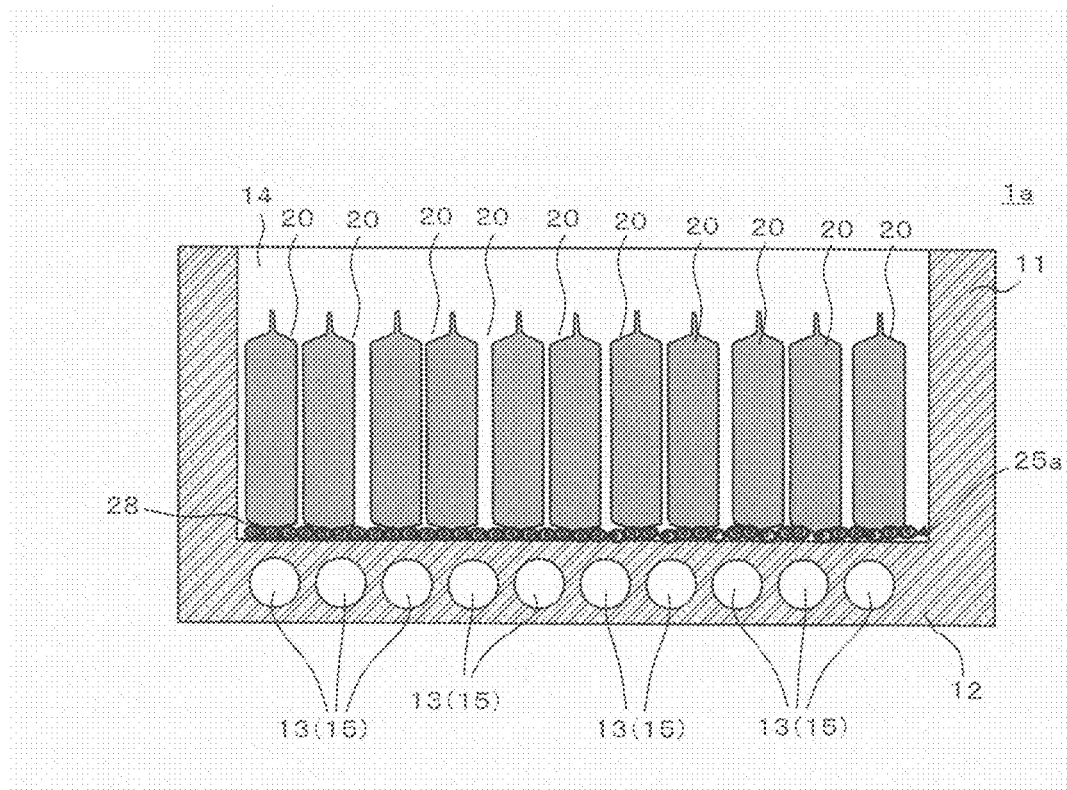
FIG. 5A is a longitudinal sectional view of the heat dissipating structure according to the second embodiment, and a battery having the heat dissipating structure.
Figure 5B:
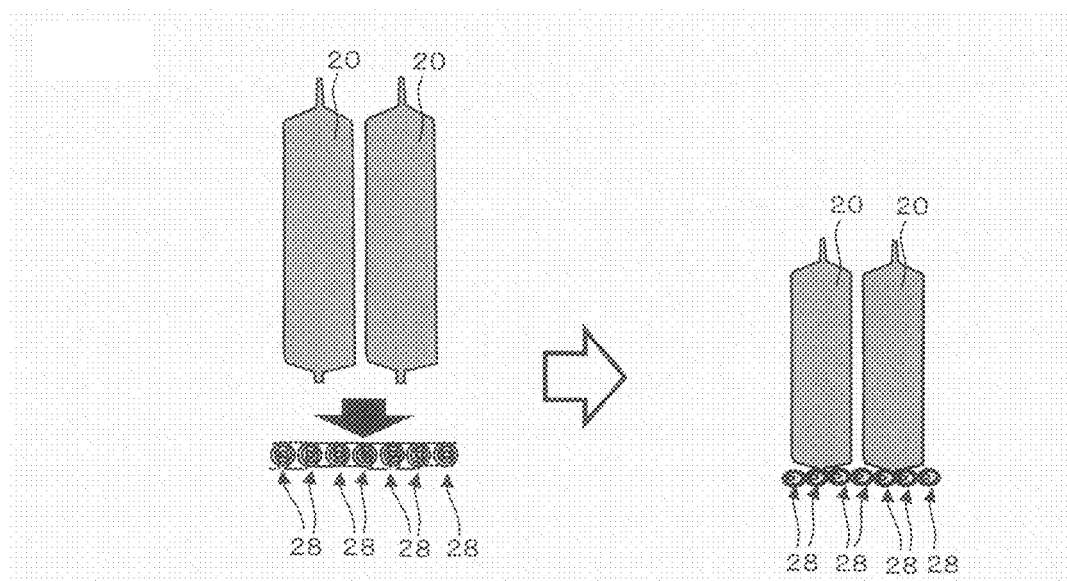
FIG. 5B is a sectional view illustrating change in formation of the heat dissipating structure before and after it is compressed by battery cells in FIG. 5A.

FIG. 4A is a plan view of the heat dissipating structure according to the second embodiment. FIG. 4B is a sectional view taken along line C-C of FIG. 4A. FIG. 4C is an enlarged view of a region D of FIG. 4B. FIG. 5A is a longitudinal sectional view of the heat dissipating structure according to the second embodiment, and a battery having the heat dissipating structure. FIG. 5B is a sectional view illustrating change in formation of the heat dissipating structure before and after it is compressed by battery cells in FIG. 5A.

Unlike the battery 1 of the first embodiment, a battery 1a according to the second embodiment includes a heat dissipating structure 25a having the multiple heat dissipating members 28 connected by a connection member 35a. Structures of this embodiment besides the connection member 35a are common with those of the first embodiment, and descriptions of such structures are omitted.

Likewise the connection member of the first embodiment, the connection member 35a is formed of the thread or the rubber as the material partially deformable at a region at least between the heat dissipating members 28. In this embodiment, the connection member 35 is preferably formed of the thread, and more preferably formed of the thread sufficient to resist the temperature rise owing to heat dissipation from the battery cell 20. The connection member 35a is used for sewing the heat dissipating members 28 using the sewing machine or the like. An arbitrary stitching for forming the connection member 35a may be selectively used from hand stitching, final stitching, zigzag stitching, single chain stitching, double chain stitching, hem stitching, flat stitching, safety stitching, overlock stitching, and the like. The stitching may also be selected from those prescribed by JIS L 0120 as codes of "101", "209", "301", "304", "401", "406", "407", "410", "501", "502", "503", "504", "505", "509", "512", "514", "602", and "605". Unlike the connection member 35 of the first embodiment, the connection member 35a does not have the twisted portions 37 each interposed between the heat dissipating members 28.

The heat dissipating structure 25a is formed in the following process. The formed heat dissipating members 28 likewise the first embodiment are orthogonally arranged to the winding direction of the heat conduction sheet 30, and connected by the connection member 35a. More specifically, the heat dissipating structure 25a is formed by connecting the arranged heat dissipating members 28 with the thread by sewing using the sewing machine or the like. The heat dissipating members 28 are arranged at each gap L2 smaller than the gap L1 (see FIG. 4C). Specifically, L2 is set to the value 11.4% (=0.114D) of the circular conversion diameter D of the heat dissipating member 28. Under the condition, the heat dissipating member 28 may be vertically crushed to have the thickness up to approximately 80% of the circular conversion diameter D. By setting the gap L2 to 0.114D or greater, the heat dissipating member 28 never becomes the obstacle to pressure deformation of the adjacent heat dissipating member 28 when they are crushed under pressure force to have each thickness equal to or smaller than 80% of the circular conversion diameter D. The smaller the gap L2 between the heat dissipating members 28 becomes, the more stable the connection between the heat dissipating members 28 becomes upon sewing using the sewing machine. The heat dissipating members 28 can be crushed to be vertically and horizontally expanded in a non-restricted manner while following and coming in tight contact with the surface of the battery cell 20 until they come in contact with each other. When the battery cells 20 are removed, the elastic force of the heat dissipating member 28 allows the heat dissipating structure 25a to have its original shape restored. The heat dissipating structure 25a having the heat dissipating members 28 blind-like connected restrains uneven distribution of the heat dissipating members 28 owing to vibration of the automobile, thus improving workability. Especially in the heat dissipating structure 25a, the heat dissipating members 28 are connected by the connection members 35a using the sewing machine or the like. This improves workability when the number of the heat dissipating members 28 constituting the heat dissipating structure 25a becomes large.

Third Embodiment

A heat dissipating structure according to a third embodiment and a battery provided with the heat dissipating structure are described. Portions common with those of the embodiments are denoted by the same reference numerals, and redundant description is omitted.

Figure 6:
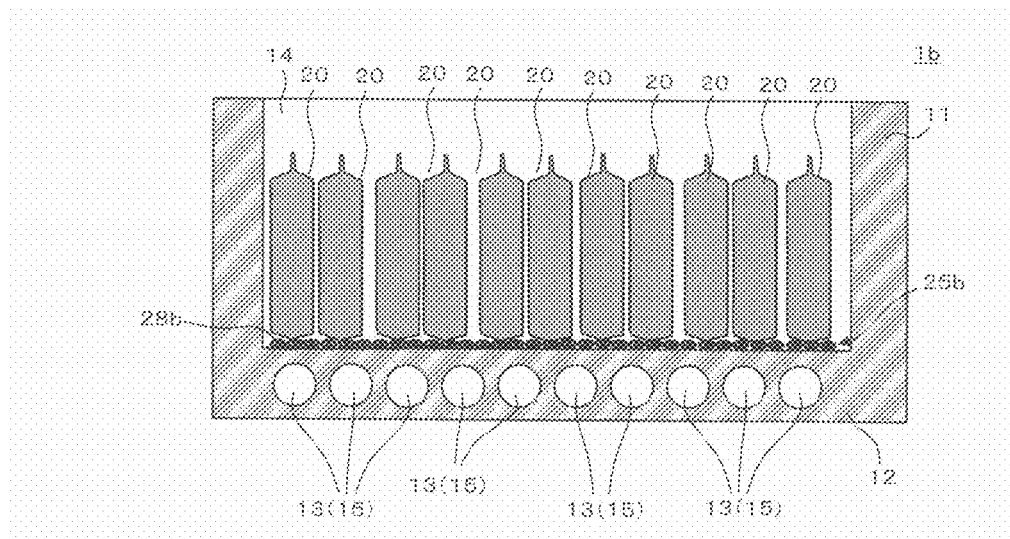
FIG. 6 is a longitudinal sectional view of a heat dissipating structure according to a third embodiment, and a battery having the heat dissipating structure.
Figure 7A:
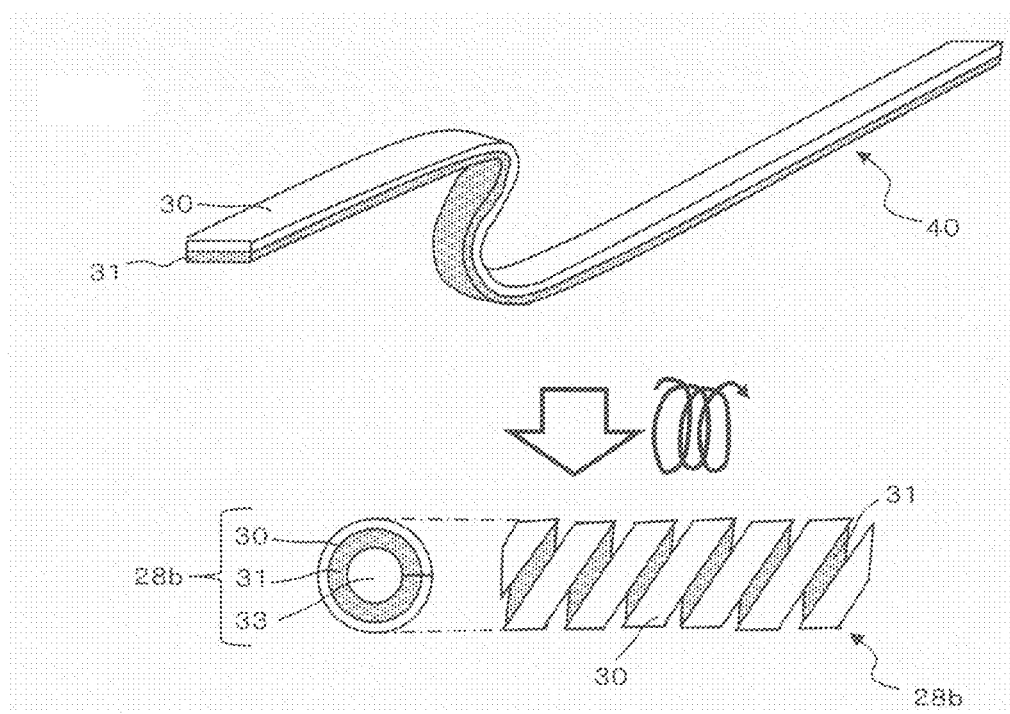
FIG. 7A shows a part of a process of forming the heat dissipating structure of FIG. 6.
Figure 7B:
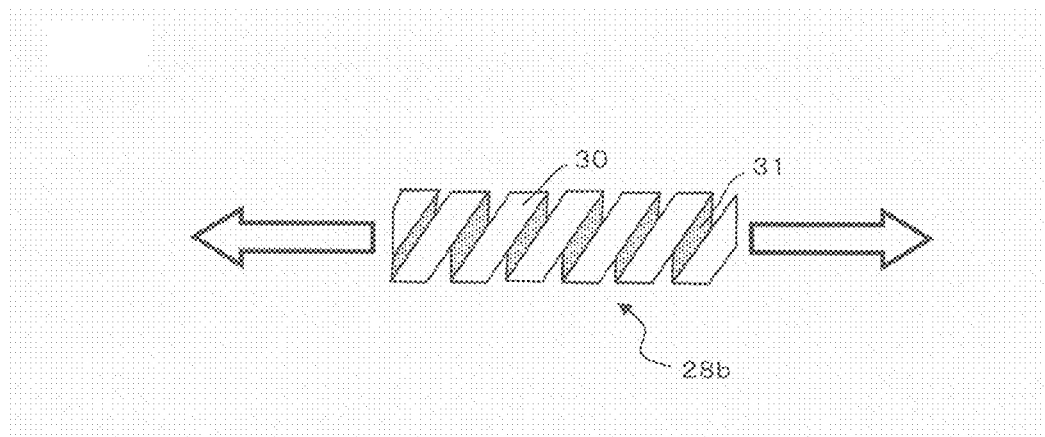
FIG. 7B is a plan view of the process as illustrated in FIG. 7A.

FIG. 6 is a longitudinal sectional view of a heat dissipating structure according to a third embodiment, and a battery having the heat dissipating structure. FIG. 7A shows a part of a process of forming the heat dissipating structure of FIG. 6. FIG. 7B is a plan view of a part of a process of forming the heat dissipating structure formed by the process as illustrated in FIG. 7A.

A battery 1b according to the third embodiment includes a heat dissipating structure 25b different from the heat dissipating structure 25 disposed in the battery 1 according to the first embodiment, and has the other structure common with the battery 1. The heat dissipating structure 25b used in this embodiment is formed by connecting a plurality of heat dissipating members 28b different from the heat dissipating members 28 of the first embodiment by the connection member 35. The cushion member 31 of the heat dissipating member 28b is not cylindrically shaped, but is belt-like shaped to be applied to the back side of the heat conduction sheet 30. The cushion member is spirally wound together with the heat conduction sheet 30.

A method of forming the heat dissipating structure 25b including the spiral cushion member 31 (also referred to as "spiral cushion member") is described below.

A laminated body 40 is formed to have two layers of the heat conduction sheet 30 and the cushion member 31 each having substantially the same width. The heat conduction oil is applied to the surface of the heat conduction sheet 30. The laminated body 40 having the surface applied with the heat conduction oil is spirally (coil-like) wound in one direction. The long heat dissipating member 28b may be formed by spirally winding the laminated body 40. The heat conduction oil may be applied to the heat conduction sheet 30 before forming the laminated body 40, or in the final step. Preferably, the heat conduction sheet 30 is laminated onto the cushion member 31 in the uncured state before it is completely cured. The cushion member 31 is then heated to be completely cured so that the laminated body 40 is formed.

The heat dissipating structure 25b is formed by connecting the multiple heat dissipating members 28b orthogonally arranged to the winding direction of the heat conduction sheet 30 using the connection member 35. As the method of connecting the heat dissipating members 28b by the connection member 35 is similar to the one according to the first embodiment, detailed description of the method is omitted.

The heat dissipating member 28b including a through passage 33 penetrating in the longitudinal direction is different from the heat dissipating member 28 of the first embodiment in that the through passage 33 further extends toward the outer surface of the heat dissipating member 28b. The spirally shaped heat dissipating member 28b is more flexible in the longitudinal direction (in white arrow directions of FIG. 7B) than the heat dissipating member 28.

The heat dissipating structure 25b can be disposed not only between the battery cells 20 and the bottom 12 of the housing 11, but also in gaps between the battery cells 20 and an inner side surface of the housing 11, and/or in gaps between the battery cells 20.

Functions and Advantageous Effects of Embodiments

The heat dissipating structures 25, 25a, 25b (to be collectively and representatively referred to as the "heat dissipating structure 25") are formed by connecting the multiple heat dissipating members 28, 28a, 28b (to be collectively and representatively referred to as the "heat dissipating member 28") respectively for enhancing heat dissipation from the battery cells 20. The heat dissipating member 28 includes the heat conduction sheet 30, the cushion member 31, and the through passages 32, 33. The heat conduction sheet 30 is spirally winding to conduct heat from the battery cell 20. The cushion member 31 is provided on the annular back surface of the heat conduction sheet 30, and deformable following the surface shape of the battery cell 20 more easily than the heat conduction sheet 30. The through passages 32, 33 penetrate in the winding direction of the heat conduction sheet 30. The connection members 35, 35a are used for connecting the multiple heat dissipating members 28 orthogonally arranged to the winding direction of the heat conduction sheet 30.

The heat dissipating structure 25 is adaptable to various forms of the battery cell 20, and excellent in elastic deformability and heat dissipation efficiency. The through passages 32, 33 contribute to weight reduction in the heat dissipating structure 25.

The cushion member 31 constituting the heat dissipating structures 25, 25a is cylindrically shaped to have the through passage 33 penetrating in the longitudinal direction. The heat conduction sheet 30 is spirally wound around the outer surface of the cylindrical cushion member. The batteries 1, 1a, 1b include the heat dissipating structures 25, 25a, 25b in contact with the battery cell 20 inside the housing 11. The heat conduction sheet 30 partially covers the outer surface of the cylindrical cushion member, and is spirally winding around the cylindrical cushion member in the longitudinal direction. In the batteries 1, 1a, the heat dissipating structures 25, 25a are respectively disposed at least between the battery 20 and the cooling agent 15. Therefore, the heat dissipating structures 25, 25a are unlikely to be constrained by the heat conduction sheet 30, and deformable following recess and protruding portions on the surface of the battery cell 20.

In the heat dissipating structure 25b, the cushion member 31 is spirally wound along the annular back surface of the heat conduction sheet 30. In the battery 1b, the heat dissipating structure 25b is disposed at least between the battery cells 20 and the cooling agent 15. The heat dissipating structure 25b may be disposed between the inner side surface of the housing 11 and the battery cells 20, and/or between the battery cells 20. The heat dissipating structure 25b is spirally shaped entirely, and therefore is more adaptable to various sizes of the battery cell 20. Specifically, the highly rigid heat conduction sheet 30 is deformable under low load to follow and comes in close contact with the surface of the battery cell 20. Furthermore, even if the deformation amount partially differs, the adhesiveness and follow-up property may be improved. As the cushion member 31 is spirally cut, the single spiral portion may be deformed separately. Therefore, the heat dissipating structure 25b may enhance flexibility in local deformation. In addition, the heat dissipating structure 25b includes not only the through passage 33, but also a spiral through groove extending from the through passage 33 to the side surface, resulting in weight reduction.

The connection member 35 is formed of a thread, and includes a twisted portion 37 between the multiple heat dissipating members 28. The heat dissipating members 28 are connected by the thread in the direction orthogonal to the winding direction of the heat conduction sheet 30. The heat dissipating structure 25 has the blind-like connected heat dissipating members 28. This makes it possible to restrain uneven distribution of the heat dissipating members 28 owing to vibration of the automobile or the like, for example, thus improving workability.

The multiple heat dissipating members 28 are arranged at each gap 0.114 times a circular conversion diameter of the heat dissipating member 28 or greater. Preferably, the connection member 35 is contractible or deformable between the heat dissipating members 28. Even if each height of the heat dissipating members 28 becomes 80% of the original height under the pressure force of the battery cell 20, the adjacent heat dissipating members 28 are flattened without overlapping. This makes it possible to enhance follow-up performance and adhesiveness to the surface of the battery cell 20. Sufficient pressure deformation of the heat dissipating members 28 allows the battery cell 20 to come in sufficiently tight contact with the heat dissipating members 28 under the weight of the battery cell 20. This makes it possible to improve heat conductivity between the battery cell 20 and the heat dissipating member 28.

The heat conduction oil is applied to the surface of the heat conduction sheet 30 for enhancing heat conduction to the surface from the battery cell 20 in contact therewith. The heat conduction sheet 30 includes gaps (holes or recess portions) on the microscopic level. Normally, air existing in the gap may exert adverse influence on heat conductivity. The heat conduction oil is filled in the gap to remove air, and further enhance heat conductivity of the heat conduction sheet 30.

The heat conduction oil contains the silicone oil and the heat conduction filler that exhibits higher heat conductivity than the silicone oil, and is composed of at least one of metal, ceramics and carbon. The silicone oil is excellent in heat resistance, cold resistance, viscosity stability, and heat conductivity. Especially, the heat conduction oil is suitably applied to the surface of the heat conduction sheet 30 to intervene between the battery cell 20 and the heat conduction sheet 30. The heat conduction filler contained in the heat conduction oil serves to enhance heat conductivity of the heat conduction sheet 30.

Each of the batteries 1, 1a, 1b includes one or more battery cells 20 as heat sources in the housing 11 that allows flow of the cooling member 15, and further includes the heat dissipating structure 25. In the heat dissipating structure 25, each of the connected heat dissipating members 28 includes the heat conduction sheet 30 spirally winding for conducting heat from the battery cell 20, the cushion member 31 that is provided on the annular back surface of the heat conduction sheet 30, and deformable following the surface shape of the battery cell 20 more easily than the heat conduction sheet 30, and the through passages 32, 33 penetrating in the winding direction of the heat conduction sheet 30. The connection members 35, 35a are used for connecting the heat dissipating members 28 orthogonally arranged to the winding direction of the heat conduction sheet 30. Each of the foregoing batteries 1, 1a, 1b includes the heat dissipating structure 25 adaptable to various forms of the battery cell 20, and excellent in heat dissipation efficiency. The through passages 32, 33 contribute to weight reduction in the heat dissipating structure 25.

Other Embodiments

The preferred embodiments of the present invention have been described. However, the present invention is not limited to those embodiments, and may be variously modified for implementation.

Figure 8:
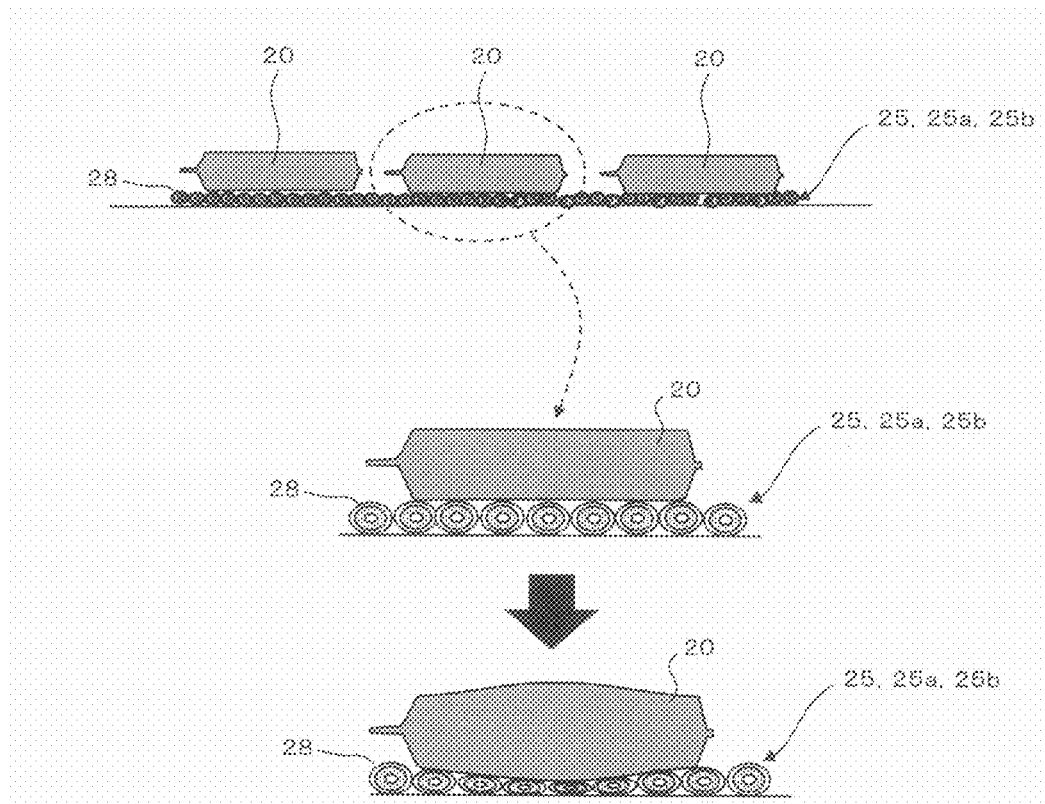
FIG. 8 shows a sectional view of battery cells placed transversely on the heat dissipating structure while having each side surface in contact therewith, a partially enlarged view, and a sectional view partially illustrating expansion of the battery cell in charging-discharging.

FIG. 8 shows a sectional view of battery cells placed transversely on the heat dissipating structure while having each side surface in contact therewith, a partially enlarged view, and a sectional view partially illustrating expansion of the battery cell in charging-discharging.

In the aforementioned embodiments, the battery cells 20 are vertically placed, having each lower end in contact with the heat dissipating structure 25. The battery cells may be arbitrarily placed without being limited to the arrangement as described above. As FIG. 8 shows, the battery cells 20 may be placed to allow the respective one side surfaces to come in contact with the respective heat dissipating members 28 of the heat dissipating structure 25. The battery cell 20 has its temperature increased in charging and discharging. The use of the highly flexible material for forming the container of the battery cell 20 may expand especially the side surface of the battery cell 20. However, as shown in FIG. 8, the heat dissipating members 28 constituting the heat dissipating structure 25 are deformable following the outer surface of the battery cell 20. This maintains high heat dissipation property even in charging and discharging.

For example, the heat source includes not only the battery cells 20 but also all heat generating elements such as a circuit board and an electronic device body. For example, the heat source may be an electronic component such as a capacitor and an IC chip. Similarly, the cooling agent 15 may be not only cooling water but also organic solvent, liquid nitrogen, and cooling gas. The heat dissipating structure 25 may be disposed in structures other than the battery 1 and the like, for example, electronic devices, home electric appliances, and power generators.

The width of the spiral cushion member 31 of the heat dissipating member 28b does not have to be the same as the width of the heat conduction sheet 30, but may be either larger or smaller.

A plurality of components of each of the embodiments can be freely combined except those regarded as impossible. For example, the heat dissipating structure 25b according to the third embodiment may be disposed in place of the heat dissipating structure 25 according to the first embodiment.

INDUSTRIAL APPLICABILITY

The heat dissipating structure according to the present invention can be utilized for, for example, various electronic devices such as automobiles, industrial robots, power generators, PCs, household electric appliances in addition to batteries for automobiles. The battery according to the present invention can be utilized as those to be used in electronic devices such as household batteries capable of charging-discharging, and PCs in addition to those for automobiles.

What is claimed is:

1. A heat dissipating structure having a plurality of heat dissipating members connected for enhancing heat dissipation from a heat source, wherein each of the heat dissipating members includes
    a heat conduction sheet in a spirally winding shape for conducting heat from the heat source,
    a cushion member provided on an annular back surface of the heat conduction sheet, the cushion member being deformable following a surface shape of the heat source more easily than the heat conduction sheet, and
    a through passage penetrating in a winding direction of the heat conduction sheet,
    wherein the heat dissipating members orthogonally arranged to the winding direction of the heat conduction sheet are connected by a connection member.

2. The heat dissipating structure of claim 1, wherein:
    the cushion member is a cylindrically shaped cushion member including the through passage extending in a longitudinal direction; and
    the heat conduction sheet is spirally wound around an outer surface of the cylindrically shaped cushion member.

3. The heat dissipating structure of claim 1, wherein the cushion member is a spirally shaped cushion member spirally winding along the annular back surface of the heat conduction sheet.

4. The heat dissipating structure of claim 1, wherein:
    the connection member formed of a thread includes a twisted portion between the heat dissipating members; and
    the heat dissipating members are connected by the thread in the direction orthogonal to the winding direction of the heat conduction sheet.

5. The heat dissipating structure of claim 1, wherein the heat dissipating members are arranged at gaps each corresponding to a value 0.114 times a circular conversion diameter of the heat dissipating member or greater.

6. The heat dissipating structure of claim 1, wherein a heat conduction oil is applied to a surface of the heat conduction sheet for enhancing heat conductivity to the surface from the heat source in contact with the surface.

7. The heat dissipating structure of claim 6, wherein the heat conduction oil includes a silicone oil, and a heat conduction filler that exhibits higher heat conductivity than the silicone oil, and contains at least one of metal, ceramics, and carbon.

8. A battery including one or more battery cells each as a heat source in a housing that allows flow of a cooling agent, wherein the heat dissipating structure of claim 1 is disposed between the battery cell and the housing.

* * * * *